（12）United States Patent
Li et al.

(10) Patent No.: US 9,312,889 B2
(45) Date of Patent: Apr. 12, 2016

(54) TUNABLE WIDEBAND RF TRANSMITTER INTERFACE

(71) Applicant: Aviacomm Inc., Sunnyvale, CA (US)

(72) Inventors: Tao Li, Campbell, CA (US); Hans Wang, Mountain View, CA (US); Binglei Zhang, San Jose, CA (US); Shih Hsiung Mo, San Jose, CA (US)

(73) Assignee: AVIACOMM INC., Sunnyvale, CA (US)

( * ) Notice: Subject to any disclaimer, the term of this patent is extended or adjusted under 35 U.S.C. 154(b) by 211 days.

(21) Appl. No.: 14/085,483

(22) Filed: Nov. 20, 2013

(65) Prior Publication Data

US 2014/0148108 A1 May 29, 2014

Related U.S. Application Data

(60) Provisional application No. 61/730,350, filed on Nov. 27, 2012.

(51) Int. Cl.
*H04B 7/02* (2006.01)
*H04B 1/04* (2006.01)

(52) U.S. Cl.
CPC ............... *H04B 1/0458* (2013.01); *H04B 1/04* (2013.01); *H04B 1/0475* (2013.01); *H04B 2001/0441* (2013.01)

(58) Field of Classification Search
CPC .................................. H04B 1/04; H04W 88/06
USPC ........... 455/101, 91, 552.1, 107, 168.1, 176.1
See application file for complete search history.

(56) References Cited

U.S. PATENT DOCUMENTS

| | | | |
|---|---|---|---|
| 6,584,304 B1 * | 6/2003 | Thomsen et al. | 455/188.1 |
| 7,259,643 B2 * | 8/2007 | Son et al. | 333/174 |
| 7,811,410 B2 * | 10/2010 | Leming et al. | 156/345.44 |
| 7,949,322 B2 * | 5/2011 | Kim et al. | 455/248.1 |
| 8,565,814 B2 * | 10/2013 | Tang et al. | 455/553.1 |
| 2006/0178122 A1 * | 8/2006 | Srinivasan et al. | 455/168.1 |

* cited by examiner

*Primary Examiner* — Sonny Trinh
(74) *Attorney, Agent, or Firm* — Shun Yao; Park, Vaughan, Fleming & Dowler LLP

(57) ABSTRACT

One embodiment of the present invention provides a multi-band RF transmitter. The RF transmitter includes an RF integrated circuit (IC) chip that includes a plurality of identical wideband ports for outputting modulated RF signals, a plurality of narrowband power amplifiers (PAs), and a plurality of matching networks. A respective narrowband power amplifier (PA) is coupled to a wideband port of the RF IC chip via a respective matching network.

11 Claims, 3 Drawing Sheets

TUNABLE WIDEBAND RF TRANSMITTER INTERFACE

RELATED APPLICATION

This application claims the benefit of U.S. Provisional Application No. 61/730,350, entitled "RF Transmitter Interface Architecture for Tunable N Port Wideband Output," by inventors Tao Li, Hans Wang, Binglei Zhang, and Shih Hsiung Mo, filed 27 Nov. 2012.

BACKGROUND

1. Field

The present disclosure relates generally to an RF transmitter. More specifically, the present disclosure relates to a tunable interface used between an RF transceiver integrated circuit (IC) chip and a plurality of narrowband power amplifiers (PAs).

2. Related Art

Traditional wireless communication systems are usually designed for a specific standard, such as GSM (Global System for Mobile Communications), Wideband Code Division Multiple Access (W-CDMA), Wi-Fi® (registered trademark of Wi-Fi Alliance of Austin, Tex.), LTE (Long Term Evolution), just to name a few. Current demand for the convergence of wireless services, so that users can access different standards from the same wireless device, is driving the development of multi-standard and multi-band transceivers, which are capable of transmitting/receiving radio signals in the entire wireless communication spectrum (most are in a frequency range of from 300 MHz to 3.6 GHz).

The multi-band/multi-standard requirement drives the need for wideband RF transceivers and power amplifiers (PAs). However, wideband PAs often suffer from lower power efficiency than narrowband PAs, and power efficiency is essential for power-constraint, compact mobile devices.

SUMMARY

One embodiment of the present invention provides a multi-band RF transmitter. The RF transmitter includes an RF integrated circuit (IC) chip that includes a plurality of identical wideband ports for outputting modulated RF signals, a plurality of narrowband power amplifiers (PAs), and a plurality of matching networks. A respective narrowband power amplifier (PA) is coupled to a wideband port of the RF IC chip via a respective matching network.

In a variation on this embodiment, the multi-band RF transmitter includes a reconfigurable multiplexer and an antenna. The multiplexer is configured to couple the antenna to one or more PAs selected based on a currently active wireless communication standard.

In a further variation, the wireless communication standard includes one of: GSM (Global System for Mobile Communications); 3G; and LTE (Long Term Evolution).

In a further variation, the multi-band RF transmitter includes a baseband controller configured to send a control signal to the multiplexer to configure the multiplexer.

In a variation on this embodiment, a carrier frequency of the modulated RF signals outputted from the plurality of identical wideband ports ranges from 300 MHz all the way up to 3.6 GHz.

In a variation on this embodiment, the matching network is tunable to ensure impedance matching between the transmitter RF IC chip and the narrowband PA based on an operating frequency of the narrowband PA.

In a variation on this embodiment, the matching networks include one or more of: a Pi network, a low-pass T network, a low-pass L network, and a band-pass L network.

In a variation on this embodiment, the RF IC chip, the PAs, and the matching networks are co-located on a single printed circuit board (PCB).

BRIEF DESCRIPTION OF THE FIGURES

In the figures, like reference numerals refer to the same figure elements.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

Overview

Embodiments of the present invention provide an interface design between a wideband RF transmitter or transceiver IC chip and a plurality of narrowband PAs. To facilitate interfacing with the plurality of narrowband PAs, the wideband RF transmitter IC includes a number of identical wideband ports. Each wideband port is coupled to a high-efficiency, narrowband PA via a tunable matching network. A highest transmit efficiency can be achieved by tuning the parameters of the matching network.

Wideband Transmitter Interface

As multi-band wireless communication standards, such as LTE, become adopted more widely by service providers, needs for the development of multi-band RF transmitters increase significantly. One conventional solution for the multi-band RF transmitter is to incorporate multiple transmitting paths, each operating at a particular frequency band. However, such a solution often results in increased component count (hence, the size of the RF IC) and power consumption as each transmitting path would need its own RF components, such as a modulator, a filter, an amplifier, etc.

Figure 1:
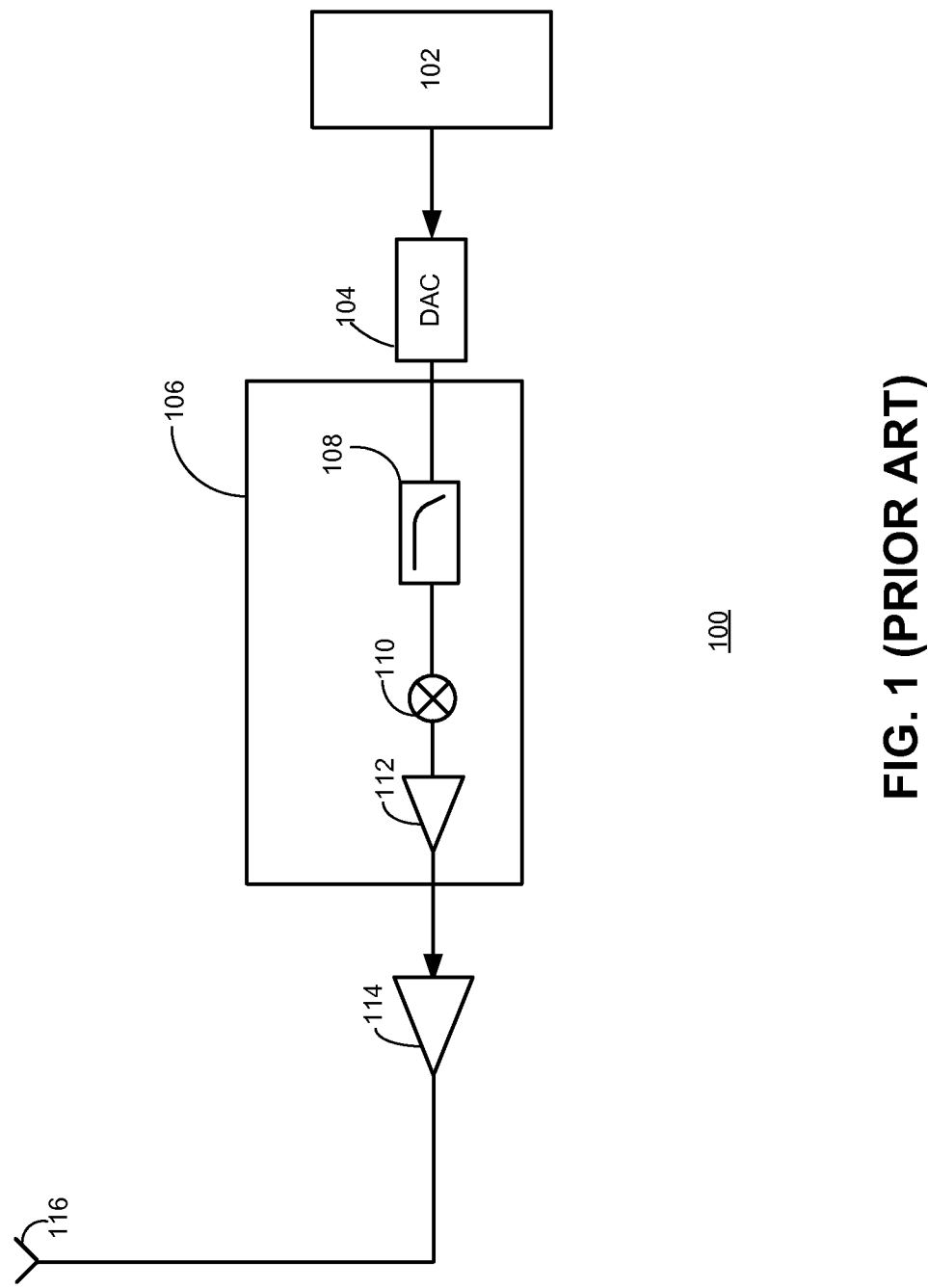
FIG. 1 presents a diagram illustrating the architecture of a conventional multi-band transmitter (prior art).

To reduce the size of the RF IC, improved multi-band RF transmitters use a single wideband transmitting path, which includes a tunable modulator having a wide tuning range and a wideband PA driver, to generate multi-band signals that are to be amplified and transmitted. A wideband PA can also be used to interface with the wideband PA driver for amplification of the multi-band signals. FIG. 1 presents a diagram illustrating the architecture of a conventional multi-band transmitter (prior art). In FIG. 1, multi-band transmitter 100 includes a baseband controller/processor 102; a DAC 104; a wideband RF integrated circuit (IC) chip 106, which further includes a low pass filter (LPF) 108, a tunable modulator 110 having a wide tuning range, and a wideband PA driver 112; a wideband PA 114; and an antenna 116.

During operation, baseband processor 102 generates baseband signals in the digital domain, and DAC 104 converts the digital baseband signals to analog signals, which are then filtered and modulated by LPF 108 and modulated to RF frequencies by modulator 110. Because modulator 110 has a wide tuning range, it is able to modulate the baseband signals to RF signals over a wide frequency range, covering multiple frequency bands. Wideband PA driver 112 and wideband PA 114 amplify the modulated signals before sending them to antenna 116 for transmission.

Although implementing wideband components (such as the modulator, the PA driver, and the PA) can result in a more compact transmitter/transceiver, wideband PAs tend to be less power efficient than narrowband PAs. Hence, to achieve the best transmitting efficiency and power efficiency, it is more desirable to implement narrowband PAs for power amplification. Moreover, most PAs are off-chip (meaning that they are discrete components not located on the transmitter or transceiver RF IC), and sometimes they may be off-the-shelf components; hence, special care is needed to facilitate interfacing between the wideband RF IC and multiple narrowband PAs. Moreover, to ensure the best transmitting efficiency, impedance matching is needed between the PA and the remaining transmitting circuit. Due to the difference in operating frequencies among the narrow band PAs, the matching networks between the narrowband PAs and the wideband RF IC need to have different parameters.

Figure 2A:
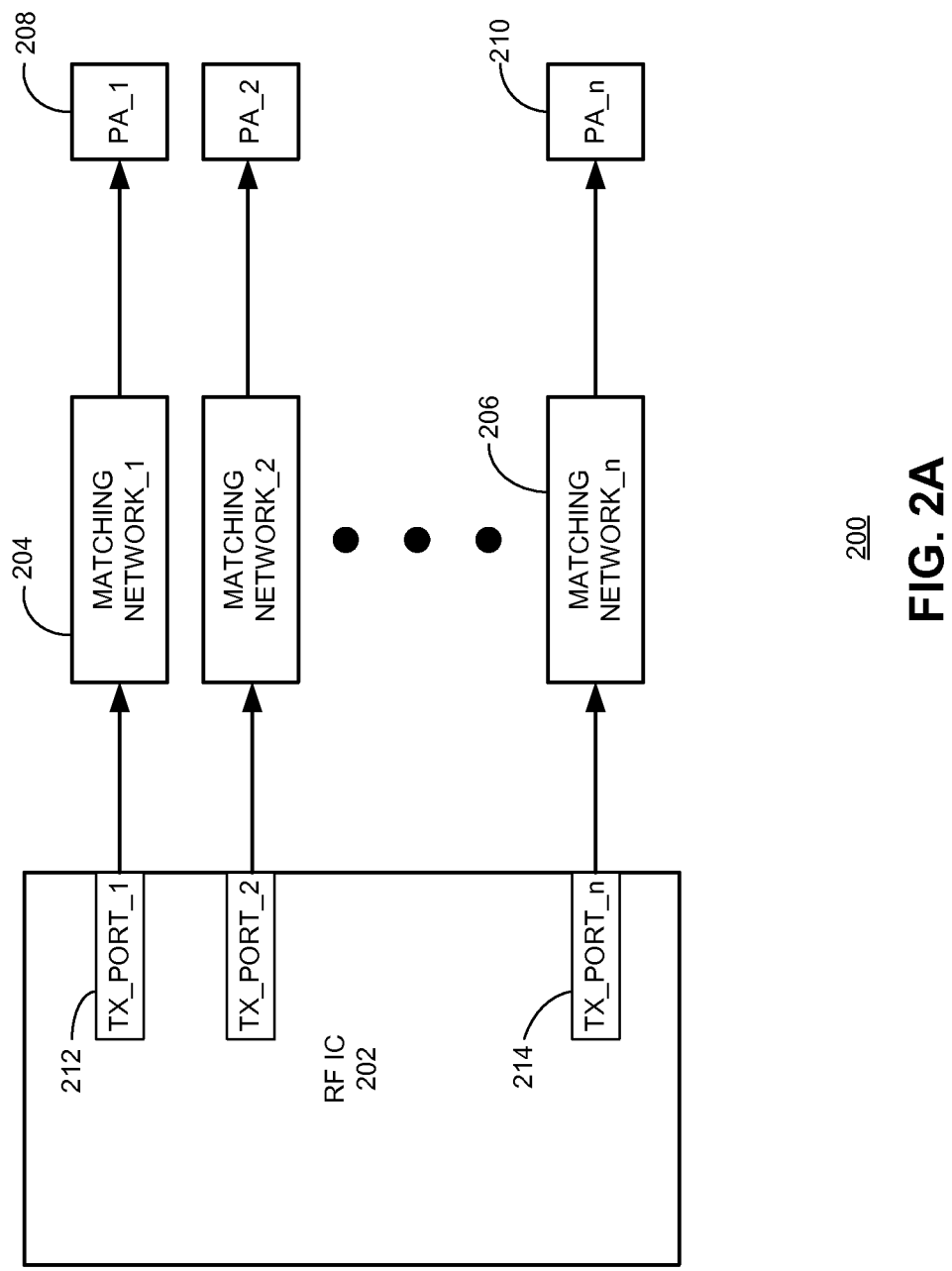
FIG. 2A presents a diagram illustrating an exemplary multi-band RF transmitter, in accordance with an embodiment of the present invention.

FIG. 2A presents a diagram illustrating an exemplary multi-band RF transmitter, in accordance with an embodiment of the present invention. In FIG. 2A, multi-band RF transmitter 200 includes a wideband RF integrated circuit (IC) chip 202, a number of matching networks, such as matching network_1 204 and matching network_n 206, and a number of narrowband PAs, such as PA_1 208 and PA_n 210.

Wideband RF IC chip 202 includes similar components and performs similar functions as RF IC chip 106 shown in FIG. 1, including modulating the baseband signals and pre-amplifying the modulated signals. Note that, depending on the currently active standard, the modulated signals may be located at different frequency bands. For example, if the current standard is GSM, the modulated signals may be at the 850 MHz band or the 1950 MHz band. For LTE, outputs of wideband RF IC chip 202 may be located at one or more other frequency bands. For a device capable of supporting multiple standards, regardless of in which frequency band the modulated signals are located, it should be able to amplify and transmit the modulated signals with the best transmitting efficiency. To do so, wideband RF IC chip 202 includes a plurality of identical wideband output ports, such as TX_port_1 212 and TX_port_n 214. RF signals will be outputted at each port regardless of their carrier frequency. In some embodiments, the wideband ports may output RF signals over a frequency range from 300 MHz all the way up to 3.6 GHz. For example, if GSM is currently active, the wideband ports may output signals in the 850 MHz or 1850 MHz band. Likewise, if LTE is currently active, the wideband ports may output signals in the 700 MHz or the 2.3 GHz band. Note that these output ports are identical, wideband ports, making the designing and fabricating of RF IC chip 202 much simpler. In other words, the manufacturer of RF IC chip 202 can fabricate such a multi-port RFIC chip without the need to consider the communication standards being supported or the operating frequencies of the coupled power amplifiers.

Each wideband port on wideband RF IC chip 202 is coupled to a narrowband PA via a matching network. For example, wideband port 212 is coupled to PA_1 208 via matching network_1 204. The bandwidth of the narrowband PA can range from a few KHz to a few hundred KHz. A matching network can include various components, such as capacitors, inductors, and resistors. In some embodiments, different types of matching networks can be used to impedance match the RF IC and the PA, including but not limited to: a Pi network, a low-pass T network, a low-pass L network, a band-pass L network, and their combinations. More specifically, each matching network includes tunable or programmable components, such as tunable capacitors, tunable inductors, and tunable resistors. By tuning the parameters of such components, impedance matching can be achieved at various different frequency bands based on the operating frequencies of the PA. For example, for GSM-enabled devices, one of the PAs should operate at the 850 MHz band and one of the PAs should operate at the 1850 MHz band (for dual-band devices). Hence, a matching network coupling the 850 MHz PA and a wideband port located on the RF IC should be able to achieve impedance matching between the PA and the RF IC at 850 MHz. Similarly, a matching network coupling the 1850 MHz PA and a different wideband port located on the RF IC should be able to achieve impedance matching between the PA and the RF IC at 1850 MHz. In addition to frequency band, other parameters of the matching network, such as return loss, can also be adjusted by tuning those tunable components.

In some embodiments, all matching networks are identical and can be tunable over a wide frequency range, such as from 300 MHz all the way up to 3.6 GHz. As a result, regardless of the operating frequency of the PA, at least one matching network can be used to provide impedance matching between the PA and the RF IC. In some embodiments, the matching networks may divide into groups, with each group including a number of identical matching networks tunable over a certain frequency range. For example, there might be two groups of matching networks, with one group being used for impedance matching over a lower frequency range (such as from 300 MHz to 1.5 GHz) and the other group being used for impedance matching over a higher frequency range (such as from 1.5 GHz to 3.6 GHz). Depending on the frequency band of the PA, a matching network selected from the first group or the second group can be used to match the impedance of the PA. Alternatively, there might be three or four groups of matching networks, each being capable of operating over a frequency range of around 500 MHz. Once the PAs are selected, corresponding matching networks can be selected and/or tuned to best minimize the return loss. In some embodiments, the matching network is tuned to ensure that the return loss to a particular PA is less than −10 dB.

During the operation of the transmitter, based on the currently active standard and/or operating frequency band, one or more of the narrowband PAs will be activated. Because the baseband controller/processor typically maintains information regarding which standard is active, the baseband controller/processor can send out control signals to the PAs to activate appropriate PAs. For example, if the baseband controller detects that the current active standard is GSM and the operating frequency band is 850 MHz band, the baseband controller then sends a control signal to a PA operating at the 850 MHz band to activate that PA. Other PAs will remain powered down as no signals in their frequency bands need to be transmitted. Alternatively, all PAs can be coupled to the antenna via a single-pole-multi-throw switch or a reconfigurable multiplexer. The switch or multiplexer is controlled by the baseband controller/processor to allow only selected PAs to transmit via the antenna, as shown in FIG. 2B.

Figure 2B:
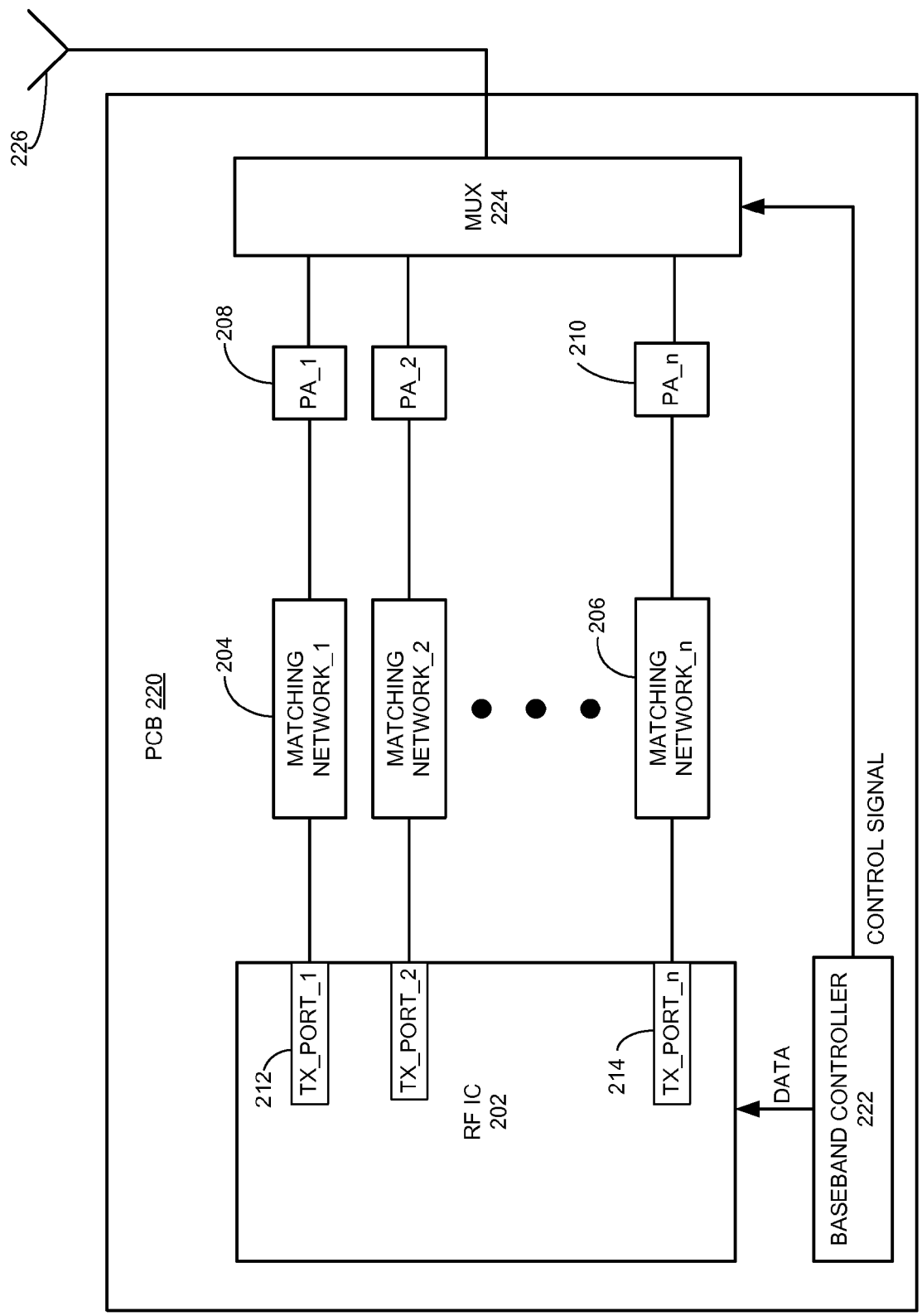
FIG. 2B presents a diagram illustrating in more detail an exemplary multi-band RF transmitter, in accordance with an embodiment of the present invention.

FIG. 2B presents a diagram illustrating in more detail an exemplary multi-band RF transmitter, in accordance with an embodiment of the present invention. In addition to the components shown in FIG. 2A, such as RF IC chip 202, the matching networks, and the PAs, the multi-band RF transmitter also includes a baseband controller 222, a reconfigurable 1×n multiplexer 224, and an antenna 226. In some embodiments, RF IC chip 202, the matching networks, the PAs, baseband controller 222, and multiplexer 224 are located on a single PCB 220.

During operation, baseband controller 222 detects which standard and/or frequency bands are currently active, and determines which PAs should be activated accordingly. In some embodiments, baseband controller 222 may send control signals to each PA to enable the selected PAs. In addition, baseband controller 222 sends a control signal to reconfigurable multiplexer 224 to enable coupling between the selected PAs and antenna 226. For example, if PA_1 208 and PA_n 210 are selected by baseband controller 222 based on the frequency bands of the signals to be transmitted, reconfigurable multiplexer 224 will be configured to only allow PA_1 208 and PA_n 210 to couple to antenna 226, whereas all other PAs will be decoupled from antenna 226.

Note that because RF IC chip 202 only needs to provide identical wideband ports without the need to designate a particular port for a particular frequency band, the design for RF IC chip 202 becomes much simpler and more straightforward. In some embodiments, the number of wideband ports provided by RF IC chip 202 can be determined based on the number of frequency bands supported. For example, in order to support GSM, 3G, and LTE simultaneously, RF IC chip 202 may include at least five identical wideband ports, with two ports for GSM, two for 3G, and one for LTE. If channel aggregation is used for LTE, more ports may be needed. In some embodiments, the chip designer may design more than enough ports to accommodate future needs of additional frequency bands.

As one can see from FIG. 2A and FIG. 2B, this interface architecture provides flexibility in selection and placement of the PAs. Because all the wideband ports on RF IC chip 202 are identical, a PA operating at a particular frequency band can be coupled to any one of the wideband ports. Hence, when designing a printed circuit board (PCB) that accommodates multi-band RF transmitter 200, the PCB designer has the freedom to place a PA at convenient locations based on the size of the PA and the available spaces without needing to consider which port the PA should be coupled to. Note that such freedom can be essential when designing high-density PCBs, which is often required by compact mobile devices. In addition, the device vendor can now select different PAs for different applications without the need to change the design or fabrication of RF IC chip 202. When a PA is swapped with a PA of a different type, the device vendor only needs to make changes to the matching network coupled to the PA to ensure that the newly swapped PA operates with the highest transmission efficiency. Changes to the matching network include, but are not limited to: changing the components (including adding, subtracting, or replacing one or more components), tuning the tunable components, and the combination thereof. Note that such alterations or tuning operations are relatively easy.

In general, embodiments of the present invention provide a flexible interface between a wideband RF IC chip and a number of narrowband power amplifiers. Note that, by incorporating multiple identical wideband output ports on the wideband RF, embodiments of the present invention significantly simplify and standardize the design of the RF IC. More specifically, when designing the RF IC, one does not need to consider what types of PAs would be used for power amplification. In addition, such an interface architecture relaxes certain constraints in laying out the transceiver PCB because a particular PA is no longer bonded to a particular port.

Note that the architecture shown in FIGS. 2A-2B is merely exemplary and should not limit the scope of this disclosure. For example, in FIG. 2B, the RF IC, the matching networks, and the PAs are co-located on a single PCB. In practice, it is also possible to have these components located on multiple PCBs. Moreover, FIG. 2B shows a reconfigurable multiplexer used to couple selected PAs and the antenna. In practice, a switch can also be used to accomplish such a task.

The foregoing descriptions of embodiments of the present invention have been presented only for purposes of illustration and description. They are not intended to be exhaustive or to limit this disclosure. Accordingly, many modifications and variations will be apparent to practitioners skilled in the art. The scope of the present invention is defined by the appended claims.

What is claimed is:

1. A multi-band RF transmitter, comprising:
an RF integrated circuit (IC) chip that includes a plurality of identical wideband ports for output modulated RF signals; and
a plurality of amplification branches, wherein a respective amplification branch includes a narrowband power amplifier (PA) and a corresponding matching network, and wherein the RF IC chip is configured in such a way that the respective amplification branch can be coupled to any wideband port on the RF IC chip.

2. The multi-band RF transmitter of claim 1, further comprising:
a reconfigurable multiplexer; and
an antenna,
wherein the multiplexer is configured to couple the antenna to the plurality of amplification branches, and wherein the multiplexer is configured to select an amplification branch based on a currently active wireless communication standard.

3. The multi-band RF transmitter of claim 2, wherein the wireless communication standard includes one of:
GSM (Global System for Mobile Communications);
3G; and
LTE (Long Term Evolution).

4. The multi-band RF transmitter of claim 2, further comprising a baseband controller configured to send a control signal to the multiplexer to configure the multiplexer.

5. The multi-band RF transmitter of claim 1, wherein a carrier frequency of the modulated RF signals outputted from the plurality of identical wideband ports ranges from 300 MHz to 3.6 GHz.

6. The multi-band RF transmitter of claim 1, wherein the matching network is tunable to ensure impedance matching between the RF IC chip and the narrowband PA based on an operating frequency of the narrowband PA.

7. The multi-band RF transmitter of claim 1, wherein the matching networks include one or more of:
a Pi network;
a low-pass T network;
a low-pass L network; and
a band-pass L network.

8. The multi-band RF transmitter of claim 1, wherein the RF IC chip, the PAs, and the matching networks are co-located on a single printed circuit board (PCB).

9. An interface device for interfacing between an antenna and a transmitter RF IC chip having a plurality of identical wideband ports, comprising:
- a plurality of amplification branches and a reconfigurable multiplexer, wherein a respective amplification branch includes a narrowband power amplifier (PA) and a corresponding matching network, and wherein the amplification branch can be configured to couple to any wideband port on the transmitter RF IC chip regardless of an operating frequency band associated with the narrowband PA of the amplification branch.

10. The interface device of claim 9, wherein the matching network is tunable to ensure impedance matching between the transmitter RF IC chip and the narrowband PA based on the operating frequency of the narrowband PA.

11. The interface device of claim 9, wherein the matching networks include one or more of:
- a Pi network;
- a low-pass T network;
- a low-pass L network; and
- a band-pass L network.

* * * * *